United States Patent
Ishida

(10) Patent No.: US 10,876,073 B2
(45) Date of Patent: Dec. 29, 2020

(54) COMPOSITION FOR SURFACE TREATMENT, AND METHOD FOR SURFACE TREATMENT USING THE SAME

(71) Applicant: FUJIMI INCORPORATED, Aichi (JP)

(72) Inventor: Yasuto Ishida, Aichi (JP)

(73) Assignee: FUJIMI INCORPORATED

( * ) Notice: Subject to any disclaimer, the term of this patent is extended or adjusted under 35 U.S.C. 154(b) by 65 days.

(21) Appl. No.: 16/324,090

(22) PCT Filed: Jun. 26, 2017

(86) PCT No.: PCT/JP2017/023409
§ 371 (c)(1),
(2) Date: Feb. 7, 2019

(87) PCT Pub. No.: WO2018/030006
PCT Pub. Date: Feb. 15, 2018

(65) Prior Publication Data
US 2019/0177656 A1    Jun. 13, 2019

(30) Foreign Application Priority Data
Aug. 9, 2016 (JP) .................................. 2016-156625

(51) Int. Cl.
C11D 3/37 (2006.01)
C11D 1/34 (2006.01)
H01L 21/304 (2006.01)
C11D 11/00 (2006.01)
H01L 21/02 (2006.01)
H01L 21/306 (2006.01)

(52) U.S. Cl.
CPC ................ *C11D 1/345* (2013.01); *C11D 1/34* (2013.01); *C11D 3/37* (2013.01); *C11D 3/3784* (2013.01); *C11D 11/0047* (2013.01); *H01L 21/02057* (2013.01); *H01L 21/304* (2013.01); *H01L 21/30625* (2013.01)

(58) Field of Classification Search
CPC ............................................... C11D 11/0047
USPC ........................................................ 510/175
See application file for complete search history.

(56) References Cited

U.S. PATENT DOCUMENTS

| | | | |
|---|---|---|---|
| 2011/0217656 A1* | 9/2011 | Taguchi ................... | G03F 7/12 430/270.1 |
| 2013/0174867 A1 | 7/2013 | Harada et al. | |
| 2014/0104675 A1* | 4/2014 | Morikawa ............... | G02F 1/167 359/296 |
| 2015/0140820 A1 | 5/2015 | Kawada et al. | |
| 2016/0272924 A1 | 9/2016 | Kajikawa et al. | |
| 2016/0339730 A1* | 11/2016 | Wariishi ................... | B41F 7/02 |
| 2017/0190167 A1* | 7/2017 | Ooshima .................. | B41M 1/06 |
| 2018/0009212 A1* | 1/2018 | Saito ......................... | B41C 1/10 |

FOREIGN PATENT DOCUMENTS

| | | |
|---|---|---|
| CN | 103865400 A | 6/2014 |
| CN | 103866326 A | 6/2014 |
| JP | 2000-208467 A | 7/2000 |
| JP | 2010-138271 A | 6/2010 |
| JP | 2012-72267 A | 4/2012 |
| JP | 2012-74678 A | 4/2012 |
| JP | 2014-141669 A | 12/2013 |
| WO | 2013/162020 A1 | 10/2013 |
| WO | 2014/089905 A1 | 6/2014 |
| WO | 2014/089906 A1 | 6/2014 |
| WO | 2015/068823 A | 5/2015 |

OTHER PUBLICATIONS

Notice of Reason for Refusal for JP Patent Application No. 2016-156625 dated Mar. 24, 2020.
International Search Report for International Application No. PCT/JP2017/023409 dated Sep. 19, 2017.

* cited by examiner

*Primary Examiner* — Gregory E Webb
(74) *Attorney, Agent, or Firm* — Katten Munchin Rosenman LLP

(57) ABSTRACT

The present invention is to provide a means with which foreign matters remaining on a surface of a polished object to be polished can be sufficiently removed. The present invention relates to a composition for surface treatment for a polished object to be polished, including: a (co)polymer containing a structural unit A having a phosphonic acid group and a divalent (poly)oxyhydrocarbon group or a salt thereof; and water, wherein a content of the structural units A exceeds 50% by mole relative to the total structural units forming the (co)polymer.

13 Claims, No Drawings

COMPOSITION FOR SURFACE TREATMENT, AND METHOD FOR SURFACE TREATMENT USING THE SAME

TECHNICAL FIELD

The present invention relates to a composition for surface treatment, and a method for surface treatment using the composition for surface treatment.

BACKGROUND ART

In recent years, with the multi-layered wiring on a surface of a semiconductor substrate, when a device is produced, a so-called chemical mechanical polishing (CMP) technique for physically polishing and planarizing a semiconductor substrate is used. CMP is a method for planarizing a surface of an object to be polished (polished object) of a semiconductor substrate or the like by using a polishing composition (slurry) containing abrasive grains of silica, alumina, ceria or the like, an anticorrosive, a surfactant, and the like, and the object to be polished (polished object) is a wiring, a plug, or the like, which is made of silicon, polysilicon, silicon oxide, silicon nitride, metal, or the like.

On a surface of a semiconductor substrate after a CMP step, a large amount of impurities (foreign matters) remains. In the impurities, abrasive grains derived from a polishing composition that has been used in CMP, a metal, an anticorrosive, an organic matter such as a surfactant, a silicon containing material that is an object to be polished, a silicon-containing material or a metal, which has been generated by polishing a metal wiring, a plug or the like, further an organic matter such as pad scraps generated from various kinds of pads, and the like are included.

When a surface of a semiconductor substrate is contaminated with these impurities, the electric characteristics of the semiconductor are adversely affected, and the reliability of a device may be lowered. Therefore, it is desirable to introduce a cleaning step after a CMP step to remove these impurities from the surface of the semiconductor substrate.

As a cleaning liquid (cleaning composition) to be used in such a cleaning step, in JP 2012-74678 A (corresponding to the specification of US 2013/174,867 A), a cleaning composition for a semiconductor substrate, which contains polycarboxylic acid or hydroxycarboxylic acid, a sulfonic acid type anionic surfactant, a carboxylic acid type anionic surfactant, and water, has been disclosed. Further, it has been disclosed that foreign matters can be removed without corroding a surface of the substrate by the cleaning composition.

SUMMARY OF INVENTION

However, even with the cleaning composition disclosed in JP 2012-74678 A (corresponding to the specification of US 2013/174,867 A), there has been a problem that foreign matters cannot be sufficiently removed in the cleaning of a polished object to be polished.

The present invention has been made in view of such a problem, and an object of the present invention to provide a means for sufficiently removing foreign matters remaining on a surface of a polished object to be polished.

In view of the above problem, the present inventors made intensive studies. As a result, the present inventors have found that the effect of removing foreign matters is remarkably improved by using a polymer compound that contains structural units each with a specific structure having a phosphonic acid (salt) group in a certain proportion or more, and thus have completed the present invention.

That is, the above-described problem of the present invention is solved by the following means.

A composition for surface treatment for a polished object to be polished, including:

a (co)polymer containing a structural unit A having a phosphonic acid group and a divalent (poly)oxyhydrocarbon group or a salt thereof; and water, wherein a content of the structural units A exceeds 50% by mole relative to the total structural units forming the (co)polymer.

DESCRIPTION OF EMBODIMENTS

Hereinafter, the present invention will be described. Note that the present invention is not limited only to the following embodiments.

In the present specification, the expression "X to Y" showing a range means "X or more and Y or less". Further, in the present specification, operations and measurements of properties and the like are performed under the conditions of room temperature (20 to 25° C.)/relative humidity 40 to 50% RH, unless otherwise noted.

In this regard, in the present specification, with respect of the specific name of a compound, the expression "(meth) acrylic" means "acrylic" and "methacrylic", and the expression "(meth)acrylate" means "acrylate" and "methacrylate".

<Foreign Matters>

The composition for surface treatment according to the present invention is used for reducing foreign matters remaining on a surface of a polished object to be polished (hereinafter, also referred to as "object to be cleaned").

The composition for surface treatment according to the present invention has a high effect of removing foreign matters regardless of the kind of the foreign matters, and exhibits an extremely high effect of removing residues (organic foreign matters) derived particularly from an organic matter. In this regard, the organic foreign matter refers to a component including an organic matter such as an organic low-molecular compound or a polymer compound, an organic salt, and the like among the foreign matters adhered to a surface of an object to be cleaned. As the organic foreign matters adhering to an object to be cleaned, for example, pad scraps generated from a pad, a component derived from an additive agent that is contained in a polishing composition or the like used in a polishing step, or the like can be mentioned. Therefore, the composition for surface treatment according to the present invention is particularly preferably used as an organic foreign matter reducing agent for selectively removing organic foreign matters.

Among the foreign matters, the organic foreign matters are greatly different from the residues derived from a metal (metal foreign matters) and the residues derived from an inorganic matter (inorganic foreign matters) in the color and shape. Accordingly, it can be visually determined whether or not the foreign matters are organic foreign matters by SEM observation. In this regard, in the determination, elemental analysis by an energy dispersive X-ray analyzer (EDX) may be used as needed.

<Polished Object to be Polished>

In the present specification, the expression "polished object to be polished" means an object to be polished after being polished in a polishing step. As the polishing step, it is not particularly limited, and a CMP step is preferred.

The polished object to be polished is preferably a polished substrate, more preferably a polished semiconductor substrate, and furthermore preferably a semiconductor substrate after CMP. In this regard, foreign matters may cause performance degradation of a semiconductor device. Therefore, in a case where the polished object to be polished is a polished semiconductor substrate, it is desirable to reduce foreign matters as much as possible in a cleaning step of a semiconductor substrate. Because of sufficiently having an effect of removing foreign matters, the composition for surface treatment according to the present invention can be suitably used for surface treatment (cleaning or the like) of such a polished semiconductor substrate.

As the composition for surface treatment according to one embodiment of the present invention, it is not particularly limited, and since the composition for surface treatment exhibits a particularly high effect of removing foreign matters, it is preferred to apply the composition for surface treatment for a polished object to be polished containing silicon nitride, silicon oxide, or polysilicon. Further, from the similar point of view, it is more preferred to apply the composition for surface treatment according to the present invention for a polished object to be polished containing silicon nitride, or silicon oxide, and it is furthermore preferred to apply the composition for surface treatment for a polished object to be polished containing silicon nitride.

Examples of the polished object to be polished containing silicon nitride, silicon oxide, or polysilicon include a polished object to be polished made of a simple substance of each of silicon nitride, silicon oxide, and polysilicon; and a polished object to be polished in a state that materials other than silicon nitride, silicon oxide or polysilicon in addition to the silicon nitride, silicon oxide or polysilicon are exposed on a surface of the polished object to be polished. In this regard, as the former one, for example, a silicon nitride substrate that is a semiconductor substrate, a silicon oxide substrate that is a semiconductor substrate or a polysilicon substrate that is a semiconductor substrate, a substrate on the outermost surface of which a silicon nitride film, a silicon oxide film, or a polysilicon film is formed, that is a semiconductor substrate, or the like can be mentioned. Further, as the latter one, the materials other than the silicon nitride, silicon oxide or polysilicon are not particularly limited, and for example, tungsten and the like can be mentioned. Specific examples of the polished object to be polished include a polished semiconductor substrate having a structure in which a silicon nitride film or a silicon oxide film is formed on the tungsten, and a polished semiconductor substrate having a structure in which a tungsten part, a silicon nitride film, and a silicon oxide film are all exposed.

In this regard, examples of the polished object to be polished containing silicon oxide include a tetraethyl orthosilicate (TEOS)-type silicon oxide film formed by using tetraethyl orthosilicate as a precursor (hereinafter, also simply referred to as "TEOS"), a high discharge pressure (HDP) film, an undoped silicate glass (USG) film, a phosphorous silicate glass (PSG) film, a borophosphosilicate glass (BPSG) film, and a rapid thermal oxide (RTO) film.

When the surface treatment (for example, cleaning treatment) is performed by using the composition for surface treatment according to one embodiment of the present invention, the polished object to be polished is preferably a polished object to be polished after rinse polishing treatment using a rinse polishing composition other than the composition for surface treatment according to the present invention.

<Composition for Surface Treatment>

One embodiment of the present invention is a composition for surface treatment for a polished object to be polished, including a (co)polymer containing a structural unit A having a phosphonic acid group and a divalent (poly) oxyhydrocarbon group or a salt thereof; and water, in which the content of the structural units A exceeds 50% by mole relative to the total structural units forming the (co)polymer. According to the present invention, a means with which foreign matters remaining on a surface of a polished object to be polished can be sufficiently removed is provided.

In this regard, in the present specification, as will be described in detail below, the expression "surface treatment" is referred to as a concept containing, for example, cleaning treatment and rinse polishing treatment for a polished object to be polished. Therefore, the composition for surface treatment according to one embodiment of the present invention is used as a cleaning composition or a rinse polishing composition.

The present inventors presume the mechanism with which the above-described problem is solved by the present invention as follows.

First, a case where an object to be cleaned is positively charged is considered. In a (co)polymer containing a structural unit A in a composition for surface treatment, the anionized phosphonic acid (salt) group in the structural unit A exhibits hydrophilicity, and a part other than the phosphonic acid (salt) group in the (co)polymer, for example, a hydrocarbon group such as an alkyl group or an alkylene group exhibits hydrophobicity as a hydrophobic site. Further, the (co)polymer containing a structural unit A wraps around the surface of the foreign matter by electrostatic adsorption of the anionized phosphonic acid (salt) group that is apart of the (co)polymer to a positively-charged foreign matter. In addition, in general, a surface of a foreign matter that is not positively charged exhibits hydrophobicity, and therefore, for a foreign matter that is not positively charged, the (co)polymer containing a structural unit A wraps around the surface of the foreign matter by hydrophobic interaction of the hydrophobic site with the foreign matter. As a result, the foreign matter and the (co)polymer containing a structural unit A form a micelle including the (co)polymer containing a structural unit A on the outer side and the foreign matter on the inner side, in which an anionized phosphonic acid (salt) group being a hydrophilic group is directed outward (side of water). On the other hand, the (co)polymer containing a structural unit A is electrostatically adsorbed to an object to be cleaned via the anionized phosphonic acid (salt) group that is a part of the (co) polymer. Subsequently, the surface of the object to be cleaned is covered with a (co)polymer containing a structural unit A, and covered with an anionized phosphonic acid (salt) group that faces the side opposite to the surface of the object to be cleaned (side of water) and is a hydrophilic group. As a result, electrostatic repulsion is generated between the anionized phosphonic acid (salt) group facing the outer side of the micelle (side of water) and the anionized phosphonic acid (salt) group facing the side opposite to the surface of the object to be cleaned (side of water). Further, as the micelle is formed between the foreign matter and the (co)polymer containing a structural unit A, the electrostatic repulsion is increased, and therefore, the foreign matter adhered to an object to be cleaned is removed from the surface of the object to be cleaned, and dispersed in water. In addition, as a result of the generation of such electrostatic repulsion, the foreign matter once removed from the surface of the object to be cleaned is prevented from re-adhering onto the surface of the object to be cleaned.

Further, in a case where the surface of the object to be cleaned is not positively charged, the foreign matter is removed due to a mechanism different from that of the positively-charged object to be cleaned. In general, a foreign matter that is not positively charged and a surface of an object to be cleaned exhibit hydrophobicity. Between such a foreign matter and such a surface of an object to be cleaned, hydrophobic interaction is easily generated, and the foreign matter is in a state of easily adhering to a surface of an object to be cleaned. At this time, the foreign matter once removed from a surface of an object to be cleaned by mechanical action in surface treatment re-adheres to the surface of the object to be cleaned, and therefore, there may be a case where the foreign matter is not sufficiently removed from a surface of an object to be cleaned even if surface treatment is performed with a conventional cleaning composition or rinse polishing composition. However, the (co)polymer containing a structural unit A can strongly hydrophobically interacts particularly with a hydrophobic object to be cleaned. Subsequently, the surface of the object to be cleaned is covered with a (co)polymer containing a structural unit A, and covered with an anionized phosphonic acid (salt) group that faces the side opposite to the surface of the object to be cleaned (side of water) and is a hydrophilic group. As a result, the foreign matter that is hydrophobic cannot be adsorbed onto the surface of the object to be cleaned by the hydrophobic interaction, and is prevented from re-adhering onto the surface of the object to be cleaned.

In addition, the (co)polymer containing a structural unit A is easily removed after a surface treatment step (for example, cleaning step), and therefore, the (co)polymer itself does not cause foreign matters.

In this regard, the above-described mechanism is based on speculation, and the correct or incorrect does not affect the technical scope of the present invention.

Hereinafter, each of the components contained in the composition for surface treatment will be described.

[(Co)Polymer Containing Structural Unit a Having Phosphonic Acid Group and Divalent (Poly)Oxyhydrocarbon Group or Salt Thereof]

One embodiment of the present invention includes a (co)polymer containing a structural unit A having a phosphonic acid group (—P(=O) (OH)$_2$) and a divalent (poly) oxyhydrocarbon group or a salt thereof (hereinafter, also referred to as a "phosphonic acid-based (co)polymer"). That is, the structural unit A contains a phosphonic acid (salt) group and a divalent (poly)oxyhydrocarbon group.

In the present specification, the expression "phosphonic acid (salt) group" is referred to as a phosphonic acid group (—P(=O) (OH)$_2$) or a salt thereof. In this regard, in the present specification, the expression "having a phosphonic acid (salt) group" means that it is sufficient for the compound to have a partial structure represented by a phosphonic acid group (—P(=O) (OH)$_2$) or a salt thereof, and for example, a case where the phosphonic acid (salt) group is present in a form of a phosphoric acid (salt) group (phosphoric acid group (—O—P(=O) (OH)$_2$) or a salt thereof) is also included. Further, the expression "divalent (poly)oxyhydrocarbon group" means at least one of a divalent oxyhydrocarbon group represented by (—O—R—) or (—R—O—) (where R represents a divalent hydrocarbon group), and a divalent polyoxyhydrocarbon group in which 2 or more divalent hydrocarbon groups are linked by an ether bond.

In the composition for surface treatment according to one embodiment of the present invention, the structural unit A preferably has a phosphonic acid (salt) group in a form of a phosphoric acid (salt) group, more preferably has a structure in which a phosphoric acid (salt) group and a divalent (poly)oxyhydrocarbon group are directly bonded, and is furthermore preferably represented by the following general formula (1). In this regard, in the structural unit A, from the viewpoint of obtaining the higher removability of foreign matters, the divalent hydrocarbon group in the "divalent (poly)oxyhydrocarbon group" is preferably a hydrocarbon group having 1 to 18 carbon atoms, more preferably a hydrocarbon group having 1 to 12 carbon atoms, furthermore preferably a hydrocarbon group having 1 to 10 carbon atoms, particularly preferably a hydrocarbon group having 1 to 6 carbon atoms, and most preferably a hydrocarbon group having 2 carbon atoms. Further, the divalent hydrocarbon group in the "divalent (poly)oxyhydrocarbon group" may be a straight chain structure, a branched chain structure, or a cyclic structure, and is preferably an alkylene group, an alkenylene group, a phenylene group, or a cycloalkylene group, and more preferably an alkylene group.

[Chemical formula 1]

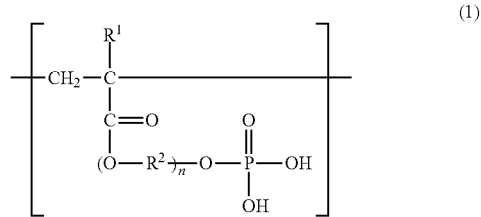

(In the formula (1), R$^1$ is a hydrogen atom or an alkyl group having 1 to 4 carbon atoms, R$^2$ is a hydrocarbon group having 1 to 18 carbon atoms, and n is 1 to 10.)

From the viewpoint of obtaining the higher removability of foreign matters, R$^1$ in the formula (1) is preferably a hydrogen atom, or an alkyl group having 1 to 3 carbon atoms, more preferably a hydrogen atom, a methyl group, or an ethyl group, furthermore preferably a hydrogen atom, or a methyl group, and particularly preferably a methyl group.

R$^2$ in the formula (1) is preferably a hydrocarbon group having 1 to 12 carbon atoms, more preferably a hydrocarbon group having 1 to 10 carbon atoms, furthermore preferably a hydrocarbon group having 1 to 6 carbon atoms, and particularly preferably a hydrocarbon group having 2 carbon atoms. Further, the kind of the hydrocarbon group that is R$^2$ may be a straight chain structure, a branched chain structure, or a cyclic structure, and is preferably an alkylene group, an alkenylene group, a phenylene group, or a cycloalkylene group, and more preferably an alkylene group.

In this regard, in the phosphonic acid-based (co)polymer, both ends of the main chain are preferably hydrogen atoms.

Specific examples of the monomer providing the structural unit A represented by the formula (1) preferably include methacryloyloxymethyl phosphate, methacryloyloxyethyl phosphate, methacryloyloxypropyl phosphate, methacryloyloxybutyl phosphate, methacryloyloxypentyl phosphate, methacryloyloxyhexyl phosphate, methacryloyloxyoctyl phosphate, methacryloyloxydecyl phosphate, methacryloyloxylauryl phosphate, methacryloyloxystearyl phosphate, methacryloyloxy-1,4-dimethylcyclohexyl phosphate, and a salt thereof. Among them, from the viewpoint of obtaining the higher removability of foreign matters, methacryloyloxymethyl phosphate, methacryloyloxyethyl phosphate, methacryloyloxypropyl phosphate, or a salt thereof is more preferred, and methacryloyloxyethyl phosphate or a salt thereof is furthermore preferred. In this regard, the methacryloyloxyethyl phosphate provides a structural unit having a structure represented by the following formula (2).

[Chemical formula 2]

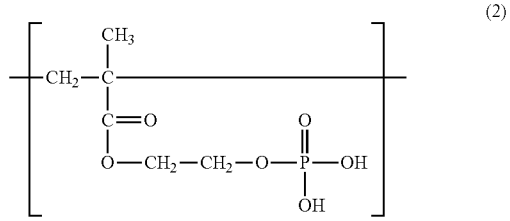

(2)

The phosphonic acid-based (co)polymer can be used in any of a form of an acid, a form of a salt, or a form in which a part of the acid is a salt (form of a partial salt). In a case where the phosphonic acid-based (co)polymer is a salt, the phosphonic acid group contained in the structural unit A may form a salt, other structural units to be described later may form a salt, or both of these may form salts, respectively. As the salt of the phosphonic acid-based (co)polymer, it is preferred that at least the phosphonic acid group contained in the structural unit A forms a salt.

In a case where the phosphonic acid group contained in the structural unit A may form a salt, the salt may be in a form in which a part of the phosphonic acid (salt) group is a salt of a phosphonic acid group (partial salt), or may be in a form in which all of the phosphonic acid (salt) group is a salt of a phosphonic acid group, and as the salt, a partial salt is more preferred.

The kind of a salt of the phosphonic acid group is not particularly limited, and examples of the salt include a metal salt, an ammonium salt, and an amine salt. In this regard, the kind of the salt may be used alone or in combination of two or more kinds thereof. As the counter ion forming a metal salt, for example, a metal belonging to Group 1, Group 11, Group 2, Group 12, Group 3, Group 13, Group 4, Group 6, Group 7, or Group 8 of the (long-form) periodic table can be mentioned. Examples of the counter ion forming the amine salt include tetramethylammonium, tetraethylammonium, and tetrabutylammonium. Among these kinds of salts, from the viewpoint of obtaining the higher removability of foreign matters, an ammonium salt or an amine salt is more preferred, and an amine salt is furthermore preferred.

In this regard, the structural unit A may be used alone or in combination of two or more kinds thereof.

The content of the structural units A exceeds 50% by mole relative to the total structural units forming the phosphonic acid-based (co)polymer according to the present invention. Further, the content of the structural units A is preferably 60% by mole or more. When the content of the structural units A is 60% by mole or more, the effect of removing foreign matters is further improved. The reason is presumed that when the structural units A are sufficiently present, the electrostatic adsorption to or the adsorption by hydrophobic interaction to foreign matters and a polished object to be polished becomes easier. From the similar point of view, the content is more preferably 70% by mole or more, furthermore preferably 80% by mole or more, still furthermore preferably 90% by mole or more, particularly preferably 95% by mole or more, and most preferably 100% by mole, that is, the phosphonic acid-based (co)polymer is a homopolymer having only the structural units A as the structural unit (the upper limit is 100% by mole).

The phosphonic acid-based (co)polymer may contain other structural units as long as the content of the structural units A satisfies the above-described range. As the monomer providing other structural units, it is not particularly limited, and examples of the monomer include a hydroxy group or glycidyl group-containing vinyl-based monomer, unsaturated carboxylic acid or a salt thereof, unsaturated carboxylic acid ester, unsaturated amide, unsaturated amine or a salt thereof, and an aromatic mono- or di-vinyl compound having no ionic group. In this regard, the ionic group refers to a group in which a part of a group among hydrophilic groups dissociates in water and divided into an anion (anion) part and a cation (cation) part. In this regard, other structural units may be used alone or in combination of two or more kinds thereof.

Examples of the hydroxy group or glycidyl group-containing vinyl-based monomer include hydroxyethyl acrylate, hydroxyethyl methacrylate, glycidyl acrylate, glycidyl methacrylate, ethylene glycol monoacrylate, ethylene glycol monomethacrylate, polyethylene glycol monoacrylate, and polyethylene glycol monomethacrylate.

Examples of the unsaturated carboxylic acid or a salt thereof include (meth)acrylic acid, itaconic acid, maleic acid, fumaric acid, crotonic acid, or a salt thereof.

Examples of the unsaturated carboxylic acid ester include methyl methacrylate, ethyl methacrylate, butyl methacrylate, hexyl methacrylate, octyl methacrylate, ethylhexyl methacrylate, decyl methacrylate, lauryl methacrylate (LMA), palmityl methacrylate, cetyl methacrylate, stearyl methacrylate (SMA), isostearyl methacrylate (ISMA), behenyl methacrylate (BMA), phenyl methacrylate, benzyl methacrylate (BzMA), cyclohexyl methacrylate, methyl acrylate, ethyl acrylate, butyl acrylate, hexyl acrylate, octyl acrylate, ethylhexyl acrylate, decyl acrylate, lauryl acrylate, palmityl acrylate, cetyl acrylate, stearyl acrylate, isostearyl acrylate, behenyl acrylate, phenyl acrylate, benzyl acrylate, and cyclohexyl acrylate. In this regard, it is assumed that the unsaturated carboxylic acid ester does not include the above-described hydroxy group or glycidyl group-containing vinyl-based monomer.

Examples of the unsaturated amide include acrylamide, methacrylamide, N-methylol acrylamide, N-methylol methacrylamide, and N-diacetone acrylamide.

Examples of the unsaturated amine or a salt thereof include aminoethyl acrylate, aminoethyl methacrylate, N,N-dimethylaminoethyl acrylate, N,N-dimethylaminoethyl methacrylate, N,N-diethylaminoethyl acrylate, N,N-diethylaminoethyl methacrylate, N,N,N-trimethylaminoethyl acrylate, and N,N,N-trimethylaminoethyl methacrylate.

Examples of the aromatic mono- or di-vinyl compound having no ionic group include a styrene-based compound such as styrene, α-methyl styrene, chlorostyrene, and alkyl styrene; and divinylbenzene.

Among them, unsaturated carboxylic acid or a salt thereof, an unsaturated carboxylic acid ester, or an aromatic mono- or di-vinyl compound having no ionic group is preferred. This is because the structural units provided from these monomers can maintain the effect of the present invention favorably, and impart the desired characteristics to the composition for surface treatment, while favorably maintaining the removability of foreign matters derived from structural units A and the removability of structural units A themselves after the surface treatment step (for example, cleaning step). The structural component provided from these monomers mainly functions as a hydrophobic site, and in a case where a hydrophobic site formed of other structural units as the structural component of a phosphonic acid-based (co)polymer, adsorption by hydrophobic interaction between the hydrophobic site and the foreign matters (in particular, organic foreign matters) is further promoted. Accordingly, it is considered that the function of controlling the charged state (surface potential) on a surface of the foreign matter to be equal to the charged state (surface potential) of the polished object to be polished becomes stronger, and by increasing the electrostatic repulsion, the removal of foreign matters can be further promoted. From the similar point of view, unsaturated carboxylic acid or a salt thereof, or an aromatic mono-vinyl compound having no ionic group is more preferred, unsaturated carboxylic acid or a salt thereof, or a styrene-based compound is furthermore preferred, (meth)acrylic acid, or styrene is still furthermore preferred, methacrylic acid, or styrene is particularly preferred, and styrene is most preferred.

In a case where other structural units are salts, the salt may be in a form of a partial salt, or may be in a form in which all of the groups capable of forming salts form salts. In this regard, the kind of the salt, and the kind of the counter ion forming a salt are not particularly limited, and for example, ones that have been mentioned above in the kind of a salt of the phosphonic acid group may be accepted.

The content of the structural units is less than 50% by mole relative to the total structural units forming the phosphonic acid-based (co)polymer according to the present invention. Further, the content of other structural units is preferably 40% by mole or less. When the content of other structural units is 40% by mole or less, the effect of removing foreign matters is further improved. The reason is presumed that when the structural units A are present in a sufficient amount, the electrostatic adsorption to or the adsorption by hydrophobic interaction to foreign matters and a polished object to be polished becomes easier. From the similar point of view, the content is more preferably 30% by mole or less, furthermore preferably 20% by mole or less, still furthermore preferably 10% by mole or less, particularly preferably 5% by mole or less, and most preferably 0% by mole, that is, the phosphonic acid-based (co)polymer is a homopolymer having only the structural units A as the structural unit (the lower limit is 0% by mole).

The arrangement of each of the structural units of the phosphonic acid-based (co)polymer may be any one of random, block, and graft.

The weight average molecular weight of the phosphonic acid-based (co)polymer is preferably 1000 or more. When the weight average molecular weight is 1000 or more, the effect of removing foreign matters is further improved. The reason is presumed that the coatability when the phosphonic acid-based (co)polymer covers a polished object to be polished or a foreign matter becomes more favorable, and action of removing foreign matters from a surface of the polished object to be polished, or action of preventing foreign matters from re-adhering onto the surface of the polished object to be polished are further improved. From the similar point of view, the weight average molecular weight more preferably exceeds 3000, and is furthermore preferably 10000 or more. Further, the upper limit value of the weight average molecular weight of the phosphonic acid-based (co)polymer is not particularly limited, and preferably 2000000 or less. The weight average molecular weight can be determined in terms of polyethylene glycol by gel permeation chromatography (GPC) using a GPC apparatus (model: Prominence+ ELSD detector (ELSD-LTII), manufactured by Shimadzu Corporation) or the like.

The method for producing a phosphonic acid-based (co)polymer is not particularly limited, and as the method, for example, a copolymerization method of monomers can be mentioned. As the copolymerization method of monomers, a polymerization method of known bulk polymerization, solution polymerization, or the like may be used. At this time, the solubility of a polymerization solvent in water (20° C.) is preferably 10% by mass or more. Examples of the polymerization solvent include water, an alcohol-based solvent, a ketone-based solvent, and an ether-based solvent. The polymerization solvent may be used alone or in combination of two or more kinds thereof. As an example of the polymerization initiator, a known radical initiator is used. In polymerization, by using a known chain transfer agent as needed, for example, by performing solution polymerization of a starting material compound with the reflux of a solvent at 40 to 300° C. under a nitrogen gas flow, or the like, the phosphonic acid-based (co)polymer can be obtained.

The phosphonic acid-based (co)polymer is preferably a water-soluble phosphonic acid-based (co)polymer.

As the phosphonic acid-based (co)polymer, a commercially available product may be used, and for example, Polyphosmer series M-101, MH-301 or the like manufactured by DAP Co., Ltd. can be used.

The content of the phosphonic acid-based (co)polymer is preferably 0.01% by mass or more relative to the total mass of the composition for surface treatment. When the content of the phosphonic acid-based (co)polymer is 0.01% by mass or more, the effect of removing foreign matters is further improved. The reason is presumed that when a polished object to be polished and a foreign matter are coated with the phosphonic acid-based (co)polymer, the coating is made in a larger area. From the similar point of view, the content of the phosphonic acid-based (co)polymer is more preferably 0.03% by mass or more, furthermore preferably 0.05% by mass or more, and particularly preferably 0.09% by mass or more, relative to the total mass of the composition for surface treatment. Further, the content of the phosphonic acid-based (co)polymer is preferably 10% by mass or less relative to the total mass of the composition for surface treatment. When the content of the phosphonic acid-based (co)polymer is 10% by mass or less, the effect of removing foreign matters is further improved. The reason is presumed that the removability of the phosphonic acid-based (co)polymer after a surface treatment step (for example, cleaning step) becomes more favorable. From the similar point of view, the content of the phosphonic acid-based (co)polymer is more preferably 5% by mass or less, furthermore preferably 1% by mass or less, and particularly preferably 0.5% by mass or less, relative to the total mass of the composition for surface treatment.

Further, the content of the phosphonic acid-based (co)polymer preferably exceeds 20% by mass relative to the total mass of the polymer compound contained in the composition for surface treatment (the upper limit is 100% by mass). When the content of the phosphonic acid-based (co)polymer exceeds 20% by mass relative to the total mass of the polymer compound, the effect of removing foreign matters is further improved. The reason is presumed that the amount of the polymer compound other than the phosphonic acid-based (co)polymer, which may cause foreign matters after a surface treatment step (for example, cleaning step), is reduced. Further, the reason is presumed that when a polished object to be polished and a foreign matter are coated with the phosphonic acid-based (co)polymer, the hindrance of coating by a polymer compound other than the phosphonic acid-based (co)polymer is reduced. Furthermore, the reason is presumed that the hindrance of the expression of an electrostatic adsorption effect or repulsion effect due to the phosphonic acid-based (co)polymer, which is caused by a polymer compound other than the phosphonic acid-based (co)polymer, is reduced. From the similar point of view, the content of the phosphonic acid-based (co)polymer more preferably exceeds 50% by mass, furthermore preferably exceeds 90% by mass, particularly preferably exceeds 95% by mass, and is most preferably 100% by mass, relative to the total mass of the polymer compound. In particular, in a case where the content of the phosphonic acid-based (co) polymer exceeds 95% by mass relative to the total mass of the polymer compound, the effect of removing foreign matters is remarkably improved. In this regard, as the polymer compounds other than the phosphonic acid-based (co)polymer, polymer compounds that are used as other additive agents to be described later, and the like can be mentioned.

[Acid]

The composition for surface treatment according to one embodiment of the present invention preferably further contains an acid. In this regard, in the present specification, the phosphonic acid-based (co)polymer is handled as being different from the acid as the additive agent described here. The acid is added mainly for the purpose of adjusting the pH of a composition for surface treatment. In addition, in a case where a polished object to be polished contains silicon nitride or silicon oxide, it is presumed that the acid plays a role of charging a surface of the polished object to be polished and a surface of a foreign matter with a positive charge. Therefore, in a case where such a composition for surface treatment is used for a foreign matter or a polished object to be polished, which has a property capable of being positively charged, by adding an acid, an electrostatic repulsion effect is further promoted, and the effect of removing foreign matters by a composition for surface treatment is further improved.

As the acid, either an inorganic acid or an organic acid may be used. As the inorganic acid, it is not particularly limited, and examples of the inorganic acid include sulfuric acid, nitric acid, boric acid, carbonic acid, hypophosphorous acid, phosphorous acid, and phosphoric acid. As the organic acid, it is not particularly limited, and examples of the organic acid include carboxylic acid such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; methanesulfonic acid; ethanesulfonic acid; and isethionic acid.

Among them, in a case where such a composition for surface treatment is used for a foreign matter or a polished object to be polished, which has a property capable of being positively charged, from the viewpoint that the effect of charging a surface of the polished object to be polished and a surface of the foreign matter with a positive charge becomes more favorable, the acid is more preferably maleic acid or nitric acid, and furthermore preferably maleic acid.

In this regard, the acid may be used alone or in combination of two or more kinds thereof.

The content of the acid is preferably 0.01% by mass or more relative to the total mass of the composition for surface treatment. When the content of the acid is 0.01% by mass or more, the effect of removing foreign matters is further improved. The reason is presumed that in a case where such a composition for surface treatment is used for a foreign matter or a polished object to be polished, which has a property capable of being positively charged, the effect of charging a surface of the polished object to be polished and a surface of the foreign matter with a positive charge becomes more favorable. From the similar point of view, the content of the acid is more preferably 0.05% by mass or more, furthermore preferably 0.1% by mass or more, and particularly preferably 0.15% by mass or more, relative to the total mass of the composition for surface treatment. Further, the content of the acid is preferably 5% by mass or less relative to the total mass of the composition for surface treatment. When the content of the acid is 5% by mass or less, the cost can be further reduced. From the similar point of view, the content of the acid is more preferably 3% by mass or less, furthermore preferably 1% by mass or less, and particularly preferably 0.30% by mass or less, relative to the total mass of the surface treatment.

[Other Additive Agents]

The composition for surface treatment according to one embodiment of the present invention may contain other additive agents at an arbitrary ratio as needed within the range not inhibiting the effect of the present invention. However, a component other than the essential components of the composition for surface treatment according to one embodiment of the present invention is not desirably added as much as possible because the component may cause foreign matters. Accordingly, the content of the component other than the essential components is preferably as small as possible, and more preferably the component is not contained. Examples of other additive agents include abrasive grains, an alkali, an anticorrosive, a dissolved gas, a reducing agent, an oxidizing agent, and alkanol amines. Among them, in order to further improve the effect of removing foreign matters, it is preferred that the composition for surface treatment does not substantially contain abrasive grains. In this regard, the expression "not substantially contain abrasive grains" is referred to as a case where the content of the abrasive grains relative to the total mass of the composition for surface treatment is 0.01% by mass or less.

[Dispersing Medium]

The composition for surface treatment according to one embodiment of the present invention contains water as a dispersing medium (solvent). The dispersing medium has a function of dispersing or dissolving each of components. The dispersing medium is not particularly limited as long as it contains water, and may be only water. Further, the dispersing medium may also be a mixed solvent of water and an organic solvent in order to disperse or dissolve each of components. In this case, examples of the organic solvent to be used include acetone, acetonitrile, ethanol, methanol, isopropanol, glycerin, ethylene glycol, and propylene glycol, which are organic solvents miscible with water. In addition, these organic solvents may be used without being mixed with water, and after dispersing or dissolving each of components, the organic solvents may be mixed with water. These organic solvent may be used alone or in combination of two or more kinds thereof. Among them, the dispersing medium is preferably only water.

From the viewpoint of inhibiting the contamination of a polished object to be polished and the action of other components, the water is preferably water not containing impurities as much as possible. For example, water in which the total content of the transition metal ions is 100 ppb or less is preferred. In this regard, the purity of water can be increased, for example, with an operation of removing impurity ions by using an ion exchange resin, of removing foreign matters by a filter, of distillation, or the like. Specifically, as the water, for example, deionized water (ion exchanged water), pure water, ultrapure water, distilled water, or the like is preferably used.

[pH Value]

The pH value of the composition for surface treatment according to one embodiment of the present invention is preferably less than 7. When the pH value is less than 7, in a case where such a composition for surface treatment is used for a foreign matter or a polished object to be polished, which has a property capable of being positively charged, a surface of the polished object to be polished or a surface of the foreign matter can be reliably charged with a positive charge. Further, as a result, a higher effect of removing foreign matters can be obtained due to the electrostatic repulsion. From the similar point of view, the pH value is more preferably less than 4, furthermore preferably 3 or less, still furthermore preferably less than 3, and particularly preferably 2.5 or less. In addition, the pH value is preferably 1 or more. When the pH value is 1 or more, the cost can be further reduced.

In this regard, the pH value of the composition for surface treatment can be confirmed by a pH meter (product name: LAQUA (registered trademark), manufactured by HORIBA Ltd.).

When the pH value is adjusted, a component other than the composition for surface treatment according to one embodiment of the present invention is not desirably added as much as possible because the component may cause foreign matters. Accordingly, it is preferred that the composition for surface treatment is prepared only with the above-described phosphonic acid-based (co)polymer, or prepared with the phosphonic acid-based (co)polymer and the above-described acid. However, in a case where it is difficult to obtain a desired pH value only by these components, other additive agents such as an alkali that can be optionally added may be used for adjusting the pH within the range not inhibiting the effect of the present invention.

[Effect of Removing Foreign Matters]

As the effect of removing foreign matters on a surface of a polished object to be polished is higher, the composition for surface treatment according to one embodiment of the present invention is more preferable. That is, after the surface treatment of the polished object to be polished with the use of the composition for surface treatment, as the number of the foreign matters remaining on the surface is smaller, the composition for surface treatment is more preferable. Specifically, in a case where the polished object to be polished contains silicon nitride, after the surface treatment of the polished object to be polished with the use of the composition for surface treatment, the number of the foreign matters is preferably 2700 or less, more preferably 2500 or less, furthermore preferably 2000 or less, still furthermore preferably 1500 or less, particularly preferably 1000 or less, and most preferably 500 or less. In addition, in a case where the polished object to be polished contains silicon oxide, after the surface treatment of the polished object to be polished with the use of the composition for surface treatment, the number of the foreign matters is preferably 800 or less, more preferably 500 or less, furthermore preferably 450 or less, still furthermore preferably 400 or less, particularly preferably 350 or less, and most preferably 300 or less. On the other hand, because as the number of foreign matters is smaller, the composition for surface treatment is more preferable, the lower limit of the number is not particularly limited, and is substantially zero.

In addition, as described above, the composition for surface treatment according to one embodiment of the present invention has a high effect of removing foreign matters regardless of the kind of the foreign matters, and particularly exhibits an extremely high effect of removing organic foreign matters. With respect to the effect of removing organic foreign matters, specifically, in a case where the polished object to be polished contains silicon nitride, after the surface treatment of the polished object to be polished with the use of the composition for surface treatment, the number of the foreign matters is preferably 1000 or less, more preferably 600 or less, furthermore preferably 500 or less, still furthermore preferably 480 or less, particularly preferably 300 or less, and most preferably 100 or less. In addition, in a case where the polished object to be polished contains silicon oxide, after the surface treatment of the polished object to be polished with the use of the composition for surface treatment, the number of the foreign matters is preferably 300 or less, more preferably 200 or less, furthermore preferably 160 or less, still furthermore preferably 120 or less, particularly preferably 100 or less, and most preferably 90 or less. On the other hand, because as the number of foreign matters is smaller, the composition for surface treatment is more preferable, the lower limit of the number is not particularly limited, and is substantially zero.

In this regard, as the number of foreign matters and the number of organic foreign matters, the values measured by the method described in Examples are adopted.

<Method for Producing Composition for Surface Treatment>

Another one embodiment of the present invention is a method for producing a composition for surface treatment, including mixing a (co)polymer containing a structural unit A having a phosphonic acid group and a divalent (poly) oxyhydrocarbon group or a salt thereof; and water, in which the content of the structural units A exceeds 50% by mole relative to the total structural units forming the (co)polymer. The kind, addition amount, and the like of the phosphonic acid-based (co)polymer are as described above. In the method for producing a composition for surface treatment according to one embodiment of the present invention, a dispersing medium and the like other than the above-described acid, abrasive grains, other additive agents, or water may also be further mixed. The kind, addition amount, and the like of the dispersing medium and the like are as described above. As the mixing method with the mixing conditions, the mixing order and the like, it is not particularly limited, and a known method can be used.

<Method for Surface Treatment>

Another one embodiment of the present invention is a method for surface treatment, including surface-treating a polished object to be polished by using the composition for surface treatment described above. In the present specification, the method for surface treatment refers to a method of reducing foreign matters on a surface of a polished object to be polished, and is a method of performing cleaning in a broad sense.

By the method for surface treatment according to one embodiment of the present invention, the remaining foreign matters can be sufficiently removed. That is, according to another one embodiment of the present invention, a method of reducing foreign matters on a surface of a polished object to be polished, in which the polished object to be polished is surface-treated with the use of the composition for surface treatment described above is provided.

The method for surface treatment according to one embodiment of the present invention is performed by a method in which the above-described composition for surface treatment is brought into contact directly with a polished object to be polished.

As the method for surface treatment, mainly, (I) a method by rinse polishing treatment, and (II) a method by cleaning treatment can be mentioned. That is, the surface treatment according to one embodiment of the present invention is preferably performed by rinse polishing or cleaning. The rinse polishing treatment and the cleaning treatment are performed by removing foreign matters (particles, metal contamination, organic residues, pad scraps, and the like) on a surface of a polished object to be polished to obtain the surface in a clean state. The above-described (I) and (II) will be described hereinafter.

(I) Rinse Polishing Treatment

The composition for surface treatment according to one embodiment of the present invention is suitably used in rinse polishing treatment. That is, the composition for surface treatment according to one embodiment of the present invention can be preferably used as a rinse polishing composition. The rinse polishing treatment is performed on a polishing table (platen) to which a polishing pad is attached for the purpose of removing foreign matters on a surface of an object to be polished after the final polishing (finish polishing) of the object to be polished. At this time, the rinse polishing treatment is performed by bringing the composition for surface treatment into contact directly with a polished object to be polished. As a result, the foreign matters on a surface of the polished object to be polished are removed by the frictional force (physical action) with a polishing pad and by the chemical action with a rinse polishing composition. Among the foreign matters, in particular, particles, and organic residues are easily removed by physical action. Therefore, in the rinse polishing treatment, by utilizing the friction with a polishing pad on a polishing table (platen), particles and organic residues can be effectively removed.

Specifically, the rinse polishing treatment can be performed by arranging a surface of the polished object to be polished after a polishing step onto a polishing table (platen) of a polishing device, by bringing the polishing pad into contact with the polished object to be polished, and by relatively sliding the polished object to be polished and the polishing pad while supplying a composition for surface treatment to the contact part.

The rinse polishing treatment can also be performed even by using either a one-side polishing device or a double-side polishing device. In addition, the polishing devices described above each are preferably provided with an ejection nozzle of a composition for surface treatment in addition to an ejection nozzle of a polishing composition. The operating conditions during the rinse polishing treatment by a polishing device are not particularly limited, and can be appropriately set by those skilled in the art.

(II) Cleaning Treatment

The composition for surface treatment according to one embodiment of the present invention is suitably used in cleaning treatment. That is, the composition for surface treatment according to one embodiment of the present invention can be preferably used as a cleaning composition. The cleaning treatment can be performed for the purpose of removing foreign matters on a surface of an object to be polished after the final polishing (finish polishing) of the object to be polished, or after the rinse polishing treatment. In this regard, the cleaning treatment and the rinse polishing treatment are classified according to the place where these treatments are performed, and the cleaning treatment is a surface treatment performed after a polished object to be polished is detached from a polishing table (platen). In also the cleaning treatment, foreign matters on a surface of a polished object to be polished can be removed by bringing a composition for surface treatment into contact directly with the polished object.

As the method for performing the cleaning treatment, for example, (i) a method in which a cleaning brush is brought into contact with one surface or both surfaces of a polished object to be polished, and the surface of the polished object to be polished is rubbed with the cleaning brush while supplying a composition for surface treatment to the contact part, in a state that the polished object to be polished is held, (ii) a method (dip-type) in which a polished object to be polished is immersed in a composition for surface treatment, and is subjected to ultrasonic treatment or stirring, or the like can be mentioned. In these methods, foreign matters on a surface of an object to be polished are removed by the frictional force with a cleaning brush or by the mechanical force generated ultrasonic treatment or stirring, and by the chemical action with a composition for surface treatment.

In the above-described method (i), as the method for bringing a composition for surface treatment into contact with a polished object to be polished, it is not particularly limited, and for example, a spin-type method in which a polished object to be polished is rotated at a high speed while flowing a composition for surface treatment from a nozzle to the polished object to be polished, a spray-type method in which a composition for surface treatment is sprayed to a polished object to be polished to perform cleaning, or the like can be mentioned.

From the viewpoint of performing the decontamination more efficiently in a short time, in the cleaning treatment, a spin-type method or a spray-type method is preferably employed, and a spin-type method is more preferably employed.

As the device for performing the cleaning treatment as described above, for example, a batch-type cleaning device for simultaneously surface-treating multiple sheets of polished objects to be polished, which are housed in a cassette; a sheet-type cleaning device for surface-treating a sheet of a polished object to be polished by mounting the sheet on a holder; or the like can be mentioned. Among them, from the viewpoint of shortening the cleaning time or the like, a method of using a sheet-type cleaning device is preferred.

Further, as the device for performing the cleaning treatment, for example, a polishing device provided with cleaning equipment for rubbing a polished object to be polished with a cleaning brush after the polished object is detached from a polishing table (platen) can be mentioned. By using such a polishing device, the cleaning treatment of a polished object to be polished can be more efficiently performed.

As such a polishing device, a common polishing device provided with a holder for holding a polished object to be polished, a motor capable of changing the rotation speed, a cleaning brush, and the like may be used. As the polishing device, either a one-side polishing device or a double-side polishing device may be used. In this regard, in a case where a rinse polishing step is performed after a CMP step, it is more efficient and preferable to perform the cleaning treatment by using a device similar to the polishing device used in the rinse polishing step.

As the cleaning brush, it is not particularly limited, and a resin brush is preferably used. As the material for a resin brush, it is not particularly limited, and for example, polyvinyl alcohol (PVA) is preferably used. Further, as the cleaning brush, it is particularly preferred to use a PVA sponge.

The cleaning conditions are also not particularly limited, and can be appropriately set depending on the kind of a polished object to be polished, and the kind and amount of foreign matters to be removed. For example, the rotation speed of the cleaning brush is preferably 10 rpm or more and 200 rpm or less, the rotation speed of the polished object to be polished is preferably 10 rpm or more and 100 rpm or less, and the pressure (polishing pressure) applied to the polished object to be polished is preferably 0.5 psi or more and 10 psi or less. The method for supplying a composition for surface treatment to a polishing pad is also not particularly limited, and for example, a method for continuously supplying (continuous pouring and flowing) with a pump or the like can be employed. The supply amount is not limited, and it is preferred that a cleaning brush and a surface of a polished object to be polished are always covered with a composition for surface treatment, and the supply amount is preferably 10 mL/min or more and 5000 mL/min or less. The cleaning time is not also particularly limited, and is preferably 5 seconds or more and 180 seconds or less in a step of using the composition for surface treatment according to one embodiment of the present invention. Within such a range, foreign matters can be removed more effectively.

As the temperature of a composition for surface treatment at the time of cleaning, it is not particularly limited, generally room temperature may be accepted, and heating to around 40° C. or more and 70° C. or less may be accepted within the range not impairing the performance in a step of using the composition for surface treatment according to one embodiment of the present invention.

In the above-described method (ii), the conditions of the cleaning method by immersion are not particularly limited, and a known technique can be used.

Before or after, or both of before and after the cleaning treatment by the methods (i) and (ii), cleaning with water may be performed.

In addition, it is preferred that a polished object to be polished after cleaning is dried by shaking off water droplets adhered to the surface with a spin dryer or the like. Further, the surface of the polished object to be polished may be dried by air blow drying.

When cleaning treatment is performed by using the composition for surface treatment according to one embodiment of the present invention, the polished object to be polished is preferably a polished object to be polished after rinse polishing treatment.

<Method for Producing Surface-Treated Substrate>

The method for surface treatment according to one embodiment of the present invention can be suitably applied when the polished object to be polished is a polished substrate (preferably, a polished semiconductor substrate, or a semiconductor substrate after CMP). That is, according to further another one embodiment of the present invention, the polished object to be polished is a polished semiconductor substrate, and a method for producing a semiconductor substrate, including surface-treating the polished semiconductor substrate by using the composition for surface treatment is also provided.

Details of the semiconductor substrate to which such a production method can be applied are as described in the description of the polished object to be polished that is surface-treated with the composition for surface treatment.

In addition, the method for producing a semiconductor substrate is not particularly limited as long as it includes a step (surface treatment step) of surface-treating a surface of a polished semiconductor substrate by using the composition for surface treatment according to one embodiment of the present invention. As the production method, for example, a method including a polishing step and a cleaning step, for forming a polished semiconductor substrate can be mentioned. In addition, as another one example, a method including a rinse polishing step between a polishing step and a cleaning step in addition to the polishing step and the cleaning step can be mentioned. Hereinafter, each of these steps will be described.

[Polishing Step]

The polishing step that can be included in a method for producing a semiconductor substrate is a step of forming a polished semiconductor substrate by polishing a semiconductor substrate.

The polishing step is not particularly limited as long as it is a step of polishing a semiconductor substrate, and the polishing step is preferably a chemical mechanical polishing (CMP) step. In addition, the polishing step may be a polishing step consisting of a single step or a polishing step consisting of multiple steps. As the polishing step consisting of multiple steps, for example, a step of performing a finish polishing step after a preliminary polishing step (rough polishing step); a step of performing a secondary polishing step once or twice after a primary polishing step, and then performing a finish polishing step; or the like can be mentioned. The surface treatment step using the composition for surface treatment according to one embodiment of the present invention is preferably performed after the above-described finish polishing step.

As the polishing composition, a known polishing composition can be appropriately used depending on the characteristics of the semiconductor substrate. As the polishing composition, it is not particularly limited, and for example, one containing abrasive grains, an acid salt, a dispersing medium, and an acid, or the like can be preferably used. As a specific example of the polishing composition, a polishing composition containing sulfonic acid-modified colloidal silica, ammonium sulfate, water, and maleic acid; or the like can be mentioned.

As the polishing device, a common polishing device that has a polishing table on which a polishing pad (polishing cloth) can be stuck may be used, and to which a holder for holding an object to be polished, a motor capable of changing the rotation speed, and the like are attached, may be used. As the polishing device, either a one-side polishing device or a double-side polishing device may be used.

As the polishing pad, a common nonwoven fabric, polyurethane, a porous fluorine resin, or the like may be used without any particular limitation. It is preferred that groove processing is applied to a polishing pad so that a polishing composition is kept on the polishing pad.

The polishing conditions are not particularly limited, and for example, the rotation speed of a polishing table and the rotation speed of a head (carrier) are preferably 10 rpm or more and 100 rpm or less. In addition, the pressure (polishing pressure) applied to an object to be polished is preferably 0.5 psi or more and 10 psi or less. The method for supplying a polishing composition to a polishing pad is also not particularly limited, and for example, a method for continuously supplying (continuous pouring and flowing) with a pump or the like can be employed. The supply amount is not limited, it is preferred that a surface of a polishing pad is always covered with a polishing composition, and the supply amount is preferably 10 mL/min or more and 5000 mL/min or less. The polishing time is not also particularly limited, and is preferably 5 seconds or more and 180 seconds or less in a step of using a polishing composition.

[Surface Treatment Step]

The surface treatment step refers to a step of reducing foreign matters on a surface of a polished object to be polished by using the composition for surface treatment according to one embodiment of the present invention. In the method for producing a semiconductor substrate, a cleaning step as a surface treatment step may be performed after a rinse polishing step, or only a rinse polishing step or only a cleaning step may be performed. Among them, in the method for producing a semiconductor substrate, it is preferred that a cleaning step as a surface treatment step is performed after a rinse polishing step.

(Rinse Polishing Step)

In the method for producing a semiconductor substrate, a rinse polishing step may be arranged between a polishing step and a cleaning step. The rinse polishing step may also be a step of reducing foreign matters on a surface of a polished object to be polished (polished semiconductor substrate) depending on the method for surface treatment (rinse polishing treatment method) according to one embodiment of the present invention.

In addition, as the rinse polishing composition, a known rinse polishing composition may be appropriately used depending on the kind of a polished semiconductor substrate, and the kind and amount of foreign matters to be removed. As the rinse polishing composition, for example, one containing a water-soluble polymer, a dispersing medium, and an acid, and the like can be preferably used, and specifically, a rinse polishing composition containing polyvinyl alcohol, water, and nitric acid may be used.

With respect to the device such as a polishing device and a polishing pad, and the polishing conditions, a device and conditions similar to those in the above-described polishing step can be applied except for supplying a rinse polishing composition instead of the polishing composition.

Details of the rinse polishing method used in a rinse polishing step are as described in the description according to the rinse polishing treatment.

(Cleaning Step)

In the method for producing a semiconductor substrate, a cleaning step may be arranged after a polishing step, or may be arranged after a rinse polishing step. The cleaning step is a step of reducing foreign matters on a surface of a polished object to be polished (polished semiconductor substrate) by the method for surface treatment (cleaning method) according to one embodiment of the present invention.

Details of the cleaning method used in a cleaning step are as described in the description according to the cleaning treatment.

EXAMPLES

The present invention will be described in more detail by way of the following Examples and Comparative Examples. However, the technical scope of the present invention is not limited only to the following Examples. Note that the expressions "%" and "part(s)" mean "% by mass" and "part (s) by mass", respectively unless otherwise noted.

<Preparation of Composition for Surface Treatment>

[Preparation of Composition for Surface Treatment A-1]

0.6 part by mass of a maleic acid aqueous solution at a concentration of 30% by mass as an organic acid, 1 part by mass of Polyphosmer M-101 manufactured by DAP Co., Ltd. as a dispersant, and 98.4 parts by mass of water (deionized water) were mixed to prepare a composition for surface treatment A-1.

[Preparation of Composition for Surface Treatment A-2]

A composition for surface treatment A-2 was prepared in a similar manner as in the preparation of composition for surface treatment A-1 except that the Polyphosmer M-101 manufactured by DAP Co., Ltd. was changed to Polyphosmer MH-301 manufactured by DAP Co., Ltd.

[Preparation of Compositions for Surface Treatment A-3, A-4, C-2 and C-4 to C-7]

0.6 part by mass of a maleic acid aqueous solution at a concentration of 30% by mass as an organic acid, 0.1 part by mass of each dispersant shown in the below, and 99.3 parts by mass of water (deionized water) were mixed to prepare compositions for surface treatment A-3, A-4, and C-2 to C-7.

[Preparation of Composition for Surface Treatment C-1]

0.6 part by mass of a maleic acid aqueous solution at a concentration of 30% by mass as an organic acid, and 99.4 parts by mass of water (deionized water) were mixed to prepare a composition for surface treatment C-1.

[Preparation of Composition for Surface Treatment C-3]

0.6 part by mass of a maleic acid aqueous solution at a concentration of 30% by mass as an organic acid, 0.25 part by mass of ARON (registered trademark) A-30SL manufactured by TOAGOSEI CO., LTD., and 99.15 parts by mass of water (deionized water) were mixed to prepare a composition for surface treatment C-3.

Details of the dispersants used in respective preparations of compositions for surface treatment are shown below.

Used for A-1: a mixture of 10% by mass of poly methacryloyloxyethyl phosphate, 75% by mass of isopropyl alcohol, and 15% by mass of water: Polyphosmer M-101 manufactured by DAP Co., Ltd.;

Used for A-2: a mixture of 10% by mass of a partial amine salt polymer of methacryloyloxyethyl phosphate, isopropyl alcohol, and water: Polyphosmer MH-301 manufactured by DAP Co., Ltd.;

Used for A-3: a methacryloyloxyethyl phosphate-methacrylic acid copolymer (80% by mole of structural units provided from methacryloyloxyethyl phosphate, and 20% by mole of structural units provided from methacrylic acid, relative to the total structural units);

Used for A-4: a methacryloyloxyethyl phosphate-styrene copolymer (90% by mole of structural units provided from methacryloyloxyethyl phosphate, and 10% by mole of structural units provided from styrene, relative to the total structural units);

Used for C-2: ethylene oxide group-containing modified polyvinyl alcohol (the weight average molecular weight is 10000): GOHSENX (registered trademark) WO320N manufactured by The Nippon Synthetic Chemical Industry Co., Ltd.;

Used for C-3: a polyacrylic acid ammonium salt (the weight average molecular weight is 6000), an aqueous solution at a solid content concentration of 40% by mass: ARON (registered trademark) A-30SL manufactured by TOAGOSEI CO., LTD.;

Used for C-4: polymethacrylic acid;

Used for C-5: a methacryloyloxyethyl phosphate-methacrylic acid copolymer (20% by mole of structural units provided from methacryloyloxyethyl phosphate, and 80% by mole of structural units provided from methacrylic acid, relative to the total structural units);

Used for C-6: a methacryloyloxyethyl phosphate-methacrylic acid copolymer (50% by mole of structural units provided from methacryloyloxyethyl phosphate, and 50% by mole of structural units provided from methacrylic acid, relative to the total structural units); and Used for C-7: a methacryloyloxyethyl phosphate-styrene copolymer (50% by mole of structural units provided from methacryloyloxyethyl phosphate, and 50% by mole of structural units provided from styrene, relative to the total structural units).

[Measurement of pH Value]

The pH value of each of the compositions for surface treatment (liquid temperature: 25° C.) was confirmed by a pH meter (model number: LAQUA (registered trademark) manufactured by HORIBA Ltd.).

The characteristics of each of the compositions for surface treatment are shown in the following Tables 1 and 2. In this regard, the expression "structural unit A (% by mole)" in Tables means the content of the structural units A (% by mole) in the total structural units. Further, the expression "-" in the column of dispersant in Tables means that the corresponding component was not used.

<Evaluation>

[Evaluation of the Number of Foreign Matters]

(Preparation of Polished Object to be Polished (Object to be Cleaned))

A polished silicon nitride substrate and a polished TEOS substrate, which had been polished in the following chemical mechanical polishing (CMP) step, and then rinse-polished in the following rinse polishing step, were prepared as a polished object to be polished (also referred to as an object to be cleaned, or a polished substrate).

«CMP step»

For a silicon nitride substrate and a TEOS substrate, each of which is a semiconductor substrate, by using a polishing composition M (composition: 4% by mass of sulfonic acid-modified colloidal silica (prepared by the method described in "sulfonic acid-functionalized silica through quantitative oxidation of thiol groups", Chem. Commun., 246-247, (2003), and having a primary particle size of 30 nm and a secondary particle size of 60 nm), 1% by mass of ammonium sulfate, and 0.018% by mass of a maleic acid aqueous solution at a concentration of 30% by mass, and solvent: water), each polishing was performed under the following conditions. In this regard, for the silicon nitride substrate and the TEOS substrate, a 300 mm wafer was used.

Polishing Device and Polishing Condition

Polishing device: FREX300E manufactured by Ebara Corporation
Polishing pad: rigid polyurethane pad IC 1010 manufactured by Nitta Haas Incorporated
Polishing pressure: 2.0 psi (1 psi=6894.76 Pa, the same applies hereinafter)
Rotation speed of polishing table: 60 rpm Rotation speed of head: 60 rpm
Supply of polishing composition: continuous pouring and flowing
Supply amount of polishing composition: 300 mL/min
Polishing time: 60 seconds «Rinse Polishing Step»

After a wafer surface was polished in the above-described CMP step, for the polished silicon nitride substrate and the polished TEOS substrate, in the same polishing device, by using a rinse polishing composition R (composition: 0.1% by mass of polyvinyl alcohol (weight average molecular weight is 10,000), solvent: water, adjusted to pH=2 with nitric acid), the rinse polishing was performed under the following conditions.

Rinse Polishing Device and Rinse Polishing Condition

Polishing device: FREX300E manufactured by Ebara Corporation
Polishing pad: rigid polyurethane pad IC 1010 manufactured by Nitta Haas Incorporated
Polishing pressure: 1.0 psi
Rotation speed of polishing table: 60 rpm
Rotation speed of head: 60 rpm
Supply of polishing composition: continuous pouring and flowing
Supply amount of polishing composition: 300 mL/min
Polishing time: 60 seconds «Surface Treatment Step (Cleaning Step)»

The wafer surface was rinse-polished in the above-described rinse polishing step, and then the wafer was detached from a polishing table (platen). Subsequently, in the same polishing device, by using each of the compositions for surface treatment prepared in the above or water (deionized water), each of the polished substrates was cleaned by a cleaning method of rubbing each of the polished substrates under the following conditions while sandwiching the wafer from the above and the below with sponges made of polyvinyl alcohol (PVA), the sponges being cleaning brushes, and applying a pressure. The results obtained by using water are shown in Comparative Examples 1 and 9. In this regard, the pH value of water was measured in the same manner as in the composition for surface treatment.

Cleaning Device and Cleaning Condition

Device: FREX300E manufactured by Ebara Corporation
Rotation speed of cleaning brush: 100 rpm
Rotation speed of object to be cleaned (polished substrate): 50 rpm
Flow rate of cleaning liquid: 1000 mL/min
Cleaning time: 60 seconds «Measurement of the Number of Foreign Matters»

For each of the cleaned substrates (each of surface-treated substrates) that had been cleaned in the above-described cleaning step, the number of foreign matters was measured by the following procedures. The evaluation results for the polished silicon nitride substrate are shown in Table 1, and the evaluation results for the polished TEOS substrate are shown in Table 2.

The polished substrate was cleaned with each of the compositions for surface treatment under the above-described cleaning conditions, and then the number (pieces) of foreign matters of 0.09 µm or more was measured. In the measurement of the number of foreign matters, SP-2 manufactured by KLA-Tencor Corporation was used. In the measurement, for one surface of the cleaned substrate, the remaining part excluding a part within a width range of 5 mm from the outer peripheral end part (part from a width of 0 mm to a width of 5 mm when the outer peripheral end part was set to be 0 mm) was measured.

«Measurement of the Number of Organic Foreign Matters»

For each of the cleaned substrates that had been cleaned in the above-described cleaning step, the number of foreign matters was measured by the following procedures. The evaluation results for the polished silicon nitride substrate are shown in Table 1, and the evaluation results for the polished TEOS substrate are shown in Table 2.

The polished substrate was cleaned with each of the compositions for surface treatment under the above-described cleaning conditions, and then the number of organic foreign matters was measured by SEM observation using Review SEM RS6000 manufactured by Hitachi, Ltd. First, in SEM observation, for one surface of the cleaned substrate, 100 defects present in the remaining part excluding a part within a width range of 5 mm from the outer peripheral end part (part from a width of 0 mm to a width of 5 mm when the outer peripheral end part was set to be 0 mm) were sampled. Next, organic foreign matters were visually distinguished from 100 defects sampled in SEM observation, the number of organic foreign matters was confirmed, and the proportion (%) of the foreign matters in the defects was calculated. Further, the product of the number (pieces) of foreign matters of 0.09 μm or more measured by using SP-2 manufactured by KLA-Tencor Corporation in the above-described evaluation of the number of defects and the proportion (%) of organic foreign matters calculated from the above-described results of SEM observation was calculated as the number (pieces) of organic foreign matters.

TABLE 1

(Cleaning of polished silicon nitride substrate)

| | Composition for surface treatment | | | | | Evaluation | |
|---|---|---|---|---|---|---|---|
| | | | (Co)polymer | | | The number of | The number of |
| | Kind | pH Value | Kind | Structural unit A (% by mole) | Ionicity | foreign matters (pieces) | organic foreign matters (pieces) |
| Example 1 | A-1 | 2 | Polymethacryloyloxyethyl phosphate | 100 | Anion | 1860 | 279 |
| Example 2 | A-2 | 2 | Partial amine salt polymer of methacryloyloxyethyl phosphate | 100 | Anion | 425 | 81 |
| Example 3 | A-3 | 2 | Methacryloyloxyethyl phosphate-methacrylic acid copolymer | 80 | Anion | 2664 | 479 |
| Example 4 | A-4 | 2 | Methacryloyloxyethyl phosphate-styrene copolymer | 90 | Anion | 2496 | 499 |
| Comparative Example 1 | Deionized water | 7 | — | — | — | 4521 | 1628 |
| Comparative Example 2 | C-1 | 2 | — | — | — | 3124 | 1250 |
| Comparative Example 3 | C-2 | 2 | Ethylene oxide group-containing modified polyvinyl alcohol | 0 | Nonion | 25664 | 9752 |
| Comparative Example 4 | C-3 | 2 | Polyacrylic acid ammonium salt | 0 | Anion | 206591 | 103296 |
| Comparative Example 5 | C-4 | 2 | Polymethacrylic acid | 0 | Anion | 15630 | 5002 |
| Comparative Example 6 | C-5 | 2 | Methacryloyloxyethyl phosphate-methacrylic acid copolymer | 20 | Anion | 9865 | 2565 |
| Comparative Example 7 | C-6 | 2 | Methacryloyloxyethyl phosphate-methacrylic acid copolymer | 50 | Anion | 5456 | 1582 |
| Comparative Example 8 | C-7 | 2 | Methacryloyloxyethyl phosphate-styrene copolymer | 50 | Anion | 6682 | 2004 |

TABLE 2

(Cleaning of polished TEOS substrate)

| | Composition for surface treatment | | | | | Evaluation | |
|---|---|---|---|---|---|---|---|
| | | | (Co)polymer | | | The number of | The number of |
| | Kind | pH Value | Kind | Structural unit A (% by mole) | Ionicity | foreign matters (pieces) | organic foreign matters (pieces) |
| Example 5 | A-1 | 2 | Polymethacryloyloxyethyl phosphate | 100 | Anion | 485 | 152 |
| Example 6 | A-2 | 2 | Partial amine salt polymer of methacryloyloxyethyl phosphate | 100 | Anion | 442 | 106 |
| Example 7 | A-3 | 2 | Methacryloyloxyethyl phosphate-methacrylic acid copolymer | 80 | Anion | 309 | 95 |
| Example 8 | A-4 | 2 | Methacryloyloxyethyl phosphate-styrene copolymer | 90 | Anion | 293 | 80 |
| Comparative Example 9 | Deionized water | 7 | — | — | — | 3266 | 2011 |

TABLE 2-continued (Cleaning of polished TEOS substrate)

| | Composition for surface treatment | | | | Evaluation | |
|---|---|---|---|---|---|---|
| | | | (Co)polymer | | The number of foreign matters (pieces) | The number of organic foreign matters (pieces) |
| | Kind | pH Value | Kind | Structural unit A (% by mole) | Ionicity | | |
| Comparative Example 10 | C-1 | 2 | — | — | — | 2188 | 1278 |
| Comparative Example 11 | C-2 | 2 | Ethylene oxide group-containing modified polyvinyl alcohol | 0 | Nonion | 4870 | 2355 |
| Comparative Example 12 | C-3 | 2 | Polyacrylic acid ammonium salt | 0 | Anion | 8756 | 4988 |
| Comparative Example 13 | C-4 | 2 | Polymethacrylic acid | 0 | Anion | 890 | 490 |

From the results described above, it was confirmed that by employing the method for surface treatment according to one embodiment of the present invention, the foreign matters remaining on a surface of a polished object to be polished can be sufficiently removed.

In more detail, as shown in Table 1, by comparing Examples 1 to 4 with Comparative Examples 1 to 8, it was confirmed that the composition for surface treatment according to one embodiment of the present invention exhibits a high effect of removing foreign matters on a surface of a polished object to be polished containing silicon nitride.

In addition, as shown in Table 2, by comparing Examples 5 to 8 with Comparative Examples 9 to 13, it was confirmed that the composition for surface treatment according to one embodiment of the present invention exhibits a high effect of removing foreign matters on a surface of a polished object to be polished containing silicon oxide.

Further, from Tables 1 and 2, it was confirmed that the method for surface treatment according to one embodiment of the present invention exhibits a high effect of removing organic removing foreign matters.

The present application is based on Japanese Patent Application No. 2016-156625, filed with the Japan Patent Office on Aug. 9, 2016, the entire content of which is hereby incorporated by reference.

The invention claimed is:

1. A method for surface treatment, comprising:
surface-treating a polished object to be polished by using a composition for surface treatment for a polished object to be polished, wherein, the composition comprises:
a (co)polymer containing a structural unit A having a phosphonic acid group and a divalent (poly)oxyhydrocarbon group or a salt thereof; and water, wherein
a content of the structural units A exceeds 50% by mole relative to the total structural units forming the (co)polymer.

2. The method for surface treatment according to claim 1, wherein the surface treatment is performed by rinse polishing, or cleaning.

3. A method for producing a composition for surface treatment for a polished object to be polished, comprising:
mixing a (co)polymer containing a structural unit A having a phosphonic acid group and a divalent (poly) oxyhydrocarbon group or a salt thereof; and water, wherein a content of the structural units A exceeds 50% by mole relative to the total structural units forming the (co)polymer.

4. The method for surface treatment according to claim 1, wherein the structural unit A is represented by the following general formula (1):

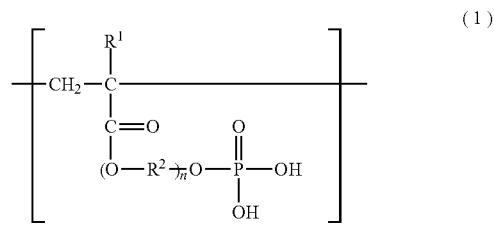

wherein $R^1$ is a hydrogen atom or an alkyl group having 1 to 4 carbon atoms, $R^2$ is a hydrocarbon group having 1 to 18 carbon atoms, and n is 1 to 10.

5. The method for surface treatment according to claim 1, wherein the composition has a pH of less than 7.

6. The method for surface treatment according to claim 1, wherein the composition further comprises an acid.

7. The method for surface treatment according to claim 1, wherein the composition does not substantially comprise abrasive grains.

8. The method for surface treatment according to claim 1, wherein the polished object to be polished is a polished object to be polished comprising silicon nitride or silicon oxide.

9. The method for producing the composition for surface treatment according to claim 3, wherein the structural unit A is represented by the following general formula (1):

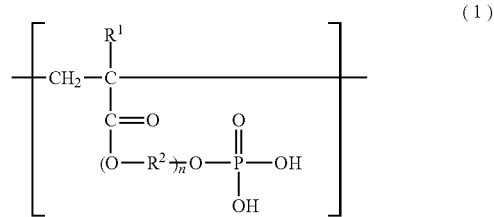

wherein $R^1$ is a hydrogen atom or an alkyl group having 1 to 4 carbon atoms, $R^2$ is a hydrocarbon group having 1 to 18 carbon atoms, and n is 1 to 10.

10. The method for producing the composition for surface treatment according to claim 3, wherein the composition has a pH of less than 7.

11. The method for producing the composition for surface treatment according to claim 3, comprising mixing an acid in addition to the (co)polymer and the water.

12. The method for producing the composition for surface treatment according to claim 3, not comprising substantially mixing abrasive grains.

13. The method for producing the composition for surface treatment according to claim 3, wherein the polished object to be polished is a polished object to be polished comprising silicon nitride or silicon oxide.

* * * * *